United States Patent [19]
Ishida et al.

[11] Patent Number: 6,054,900
[45] Date of Patent: Apr. 25, 2000

[54] POWER AMPLIFIER MMIC AND MOBILE COMMUNICATION TERMINAL

[75] Inventors: Kaoru Ishida, Shijonawate; Hiroaki Kosugi, Hirakata; Isao Nasuno, Yokohama; Kazuhiko Nakayama, Kanazawa, all of Japan

[73] Assignee: Matsushita Electric Industrial Co., Ltd., Osaka, Japan

[21] Appl. No.: 09/265,257

[22] Filed: Mar. 9, 1999

[30] Foreign Application Priority Data

Mar. 9, 1998 [JP] Japan .................................. 10-057135

[51] Int. Cl.[7] ................................ H03F 3/60; H03F 3/68; H01Q 11/12
[52] U.S. Cl. ............................ 330/286; 330/295; 455/127
[58] Field of Search ..................................... 330/286, 295, 330/302; 455/127

[56] References Cited

U.S. PATENT DOCUMENTS

| | | | |
|---|---|---|---|
| 5,111,157 | 5/1992 | Komiak | 330/286 |
| 5,119,042 | 6/1992 | Crampton et al. | 330/295 |
| 5,726,605 | 3/1998 | Morse et al. | 330/295 |
| 5,789,979 | 8/1998 | Kumar et al. | 330/149 |

*Primary Examiner*—Robert Pascal
*Assistant Examiner*—Patricia Nguyen
*Attorney, Agent, or Firm*—Ratner & Prestia

[57] ABSTRACT

A power amplifier MMIC has a first stage amplifier circuit having a transistor and matching circuits provided on input and output sides of the transistor; a plurality of final stage transistors connected in parallel; a first line connected between adjacent gates of the plurality of final stage amplifiers; a second line, connected between adjacent drains of the plurality of final stage amplifiers, for correcting an input signal phase shift caused by the presence of the first line; and an output matching circuit connected to one of connection points between the second line and the drains, and wherein an output of the first stage amplifier circuit is coupled to one gate of a final stage transistor whose drain is not connected to the output matching circuit, and the first stage amplifier circuit and the plurality of final stage transistors are arranged longitudinally alongside each other.

18 Claims, 7 Drawing Sheets

FIRST LINES

Fig. 2(C)

FIRST LINES

SECOND LINES

POWER AMPLIFIER MMIC AND MOBILE COMMUNICATION TERMINAL

BACKGROUND OF THE INVENTION

1. Field of the Invention

The present invention relates to a power amplifier MMIC used primarily in a mobile communication terminal.

2. Related Art of the Invention

In recent years, digital mobile communications have been spreading rapidly, and development of mobile terminals is vigorously under way. In the development of terminals, reductions in size, weight, and cost are strongly demanded. Size and cost reductions are also needed for radio circuitry and, among others, reducing the size and cost of power amplifiers is a key point. In digital mobile telephones, power amplifier modules using discrete semiconductor devices and chip components are mainly used as their power amplifiers. Size reduction can be achieved by fabricating the power amplifier in the form of an MMIC (Monolithic Microwave Integrated Circuit) on a semiconductor substrate. When fabricating a three-stage amplifier on a semiconductor, however, the IC chip size greatly varies depending on the arrangement of the three transistors. In a power amplifier MMIC, the semiconductor chip size is the predominant determinant of the cost. Therefore, efficient arrangement of the transistors becomes a key factor for the realization of a low cost MMIC.

Figure 4:
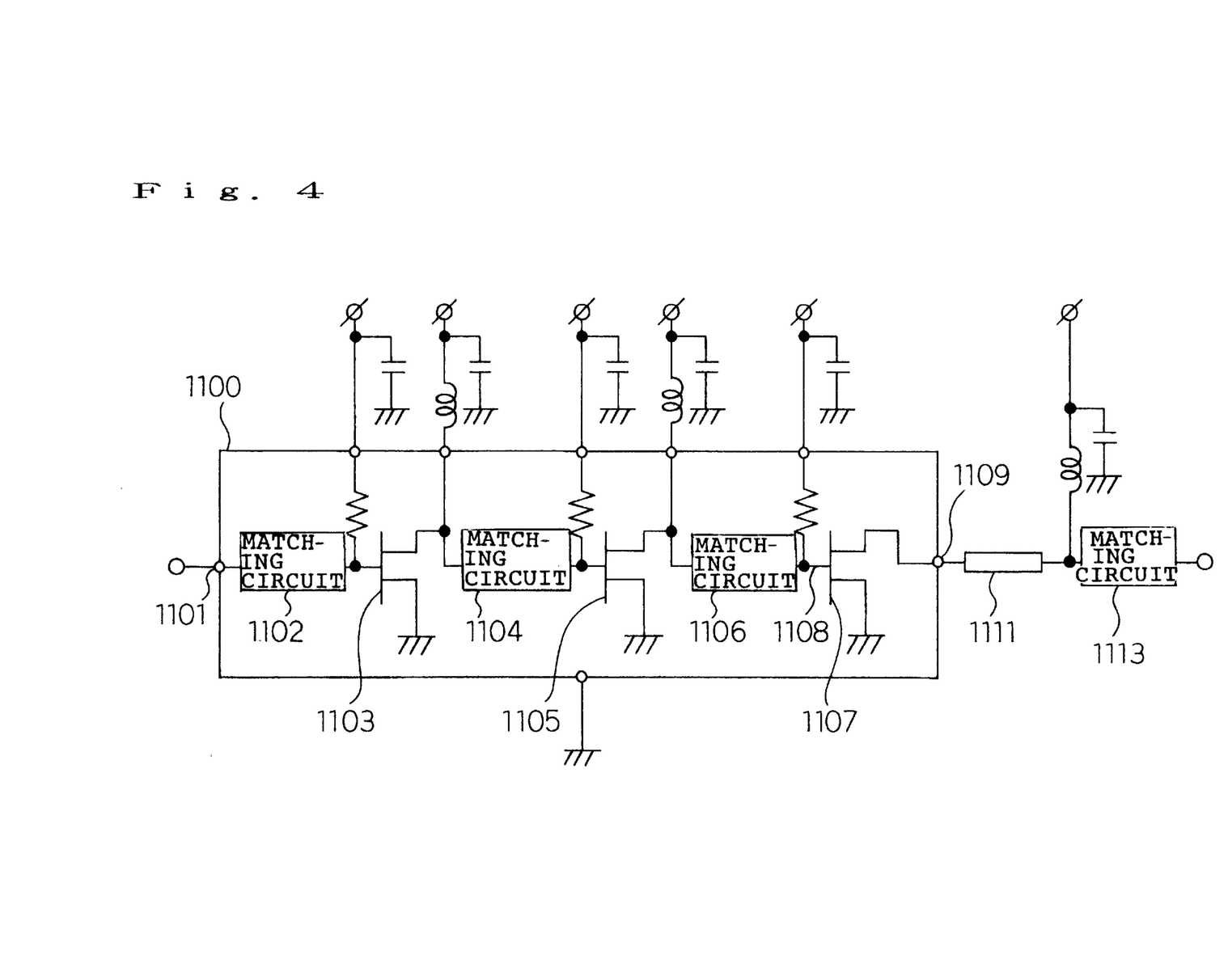
FIG. 4 is a block diagram of a conventional power amplifier.

A prior art power amplifier MMIC will be described below with reference to FIGS. 4 to 6. FIG. 4 is a circuit schematic diagram showing a conventional three-stage power amplifier MMIC. In FIG. 4, reference numeral 1100 is a semiconductor substrate, 1101 is an input terminal, 1102 is a first matching circuit, 1103 is a first transistor, 1104 is a second matching circuit, 1105 is a second transistor, 1106 is a third matching circuit, 1107 is a third transistor, 1108 is the gate terminal of the third transistor, 1109 is an output terminal, 1111 is a package lead array, and 1113 is a fourth matching circuit.

As shown in FIG. 4, the first matching circuit 1102 is connected to the gate terminal of the first transistor 1103, the second matching circuit 1104 is connected between the drain terminal of the first transistor 1103 and the gate terminal of the second transistor 1105, the third matching circuit 1106 is connected between the drain terminal of the second transistor 1105 and the gate terminal 1108 of the third transistor, and the fourth matching circuit 1113 is connected, via the package lead array 1111, to the output terminal 1109 leading from the drain terminal of the third transistor 1107. With this configuration, each matching circuit derives the desired output in the desired frequency band, and the amplifier is thus adjusted so that the desired gain can be obtained.

Figure 5:
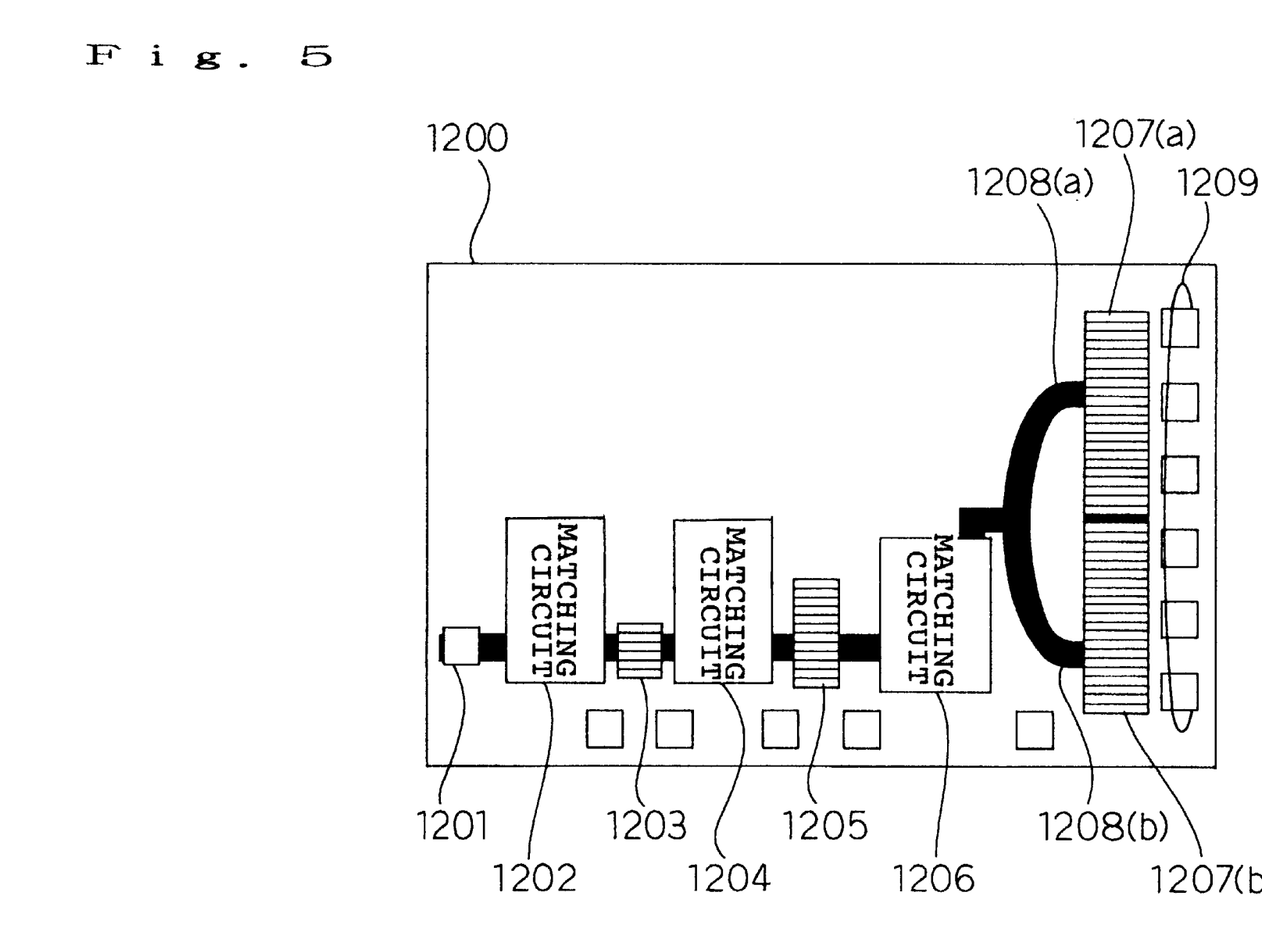
FIG. 5 is a diagram showing the basic construction of a power amplifier MMIC according to one example of the prior art.

FIG. 5 shows an example of the power amplifier fabricated in MMIC form. In FIG. 5, reference numeral 1200 is the semiconductor substrate, 1201 is the input terminal, 1202 is the first matching circuit, 1203 is the first transistor, 1204 is the second matching circuit, 1205 is the second transistor, 1206 is the third matching circuit, 1207(a) is a transistor as one half of the third transistor, 1207(b) is a transistor as the other half of the third transistor, 1208(a) is the gate terminal of the one half 1207(a) of the third transistor, 1208(b) is the gate terminal of the other half 1207(b) of the third transistor, and 1209 is an output terminal array. In the power amplifier, as is generally the case with this type of power amplifier, the transistor size increases exponentially in the order of the first transistor 1203, the second transistor 1205, and the third transistor 1207(a) and (b), as shown in FIG. 5. As a result, if these transistors are simply arranged side by side as shown in FIG. 5, the unused space of the semiconductor substrate increases, which not only hinders the reduction of chip size but also increases the cost.

In FIG. 5, the third transistor is divided into two parts; in general practice, a transistor for high output power amplification is constructed by arranging small power transistors in parallel as shown here. A detailed description of such transistors will not be given here; for details, one should refer to Chapter 5 "High Output GaAs FETS" in "Fundamentals of GaAs Field Effect Transistors," Fukuda, Hirachi et al., The Institute of Electronics, Information and Communication Engineers.

Figure 6:
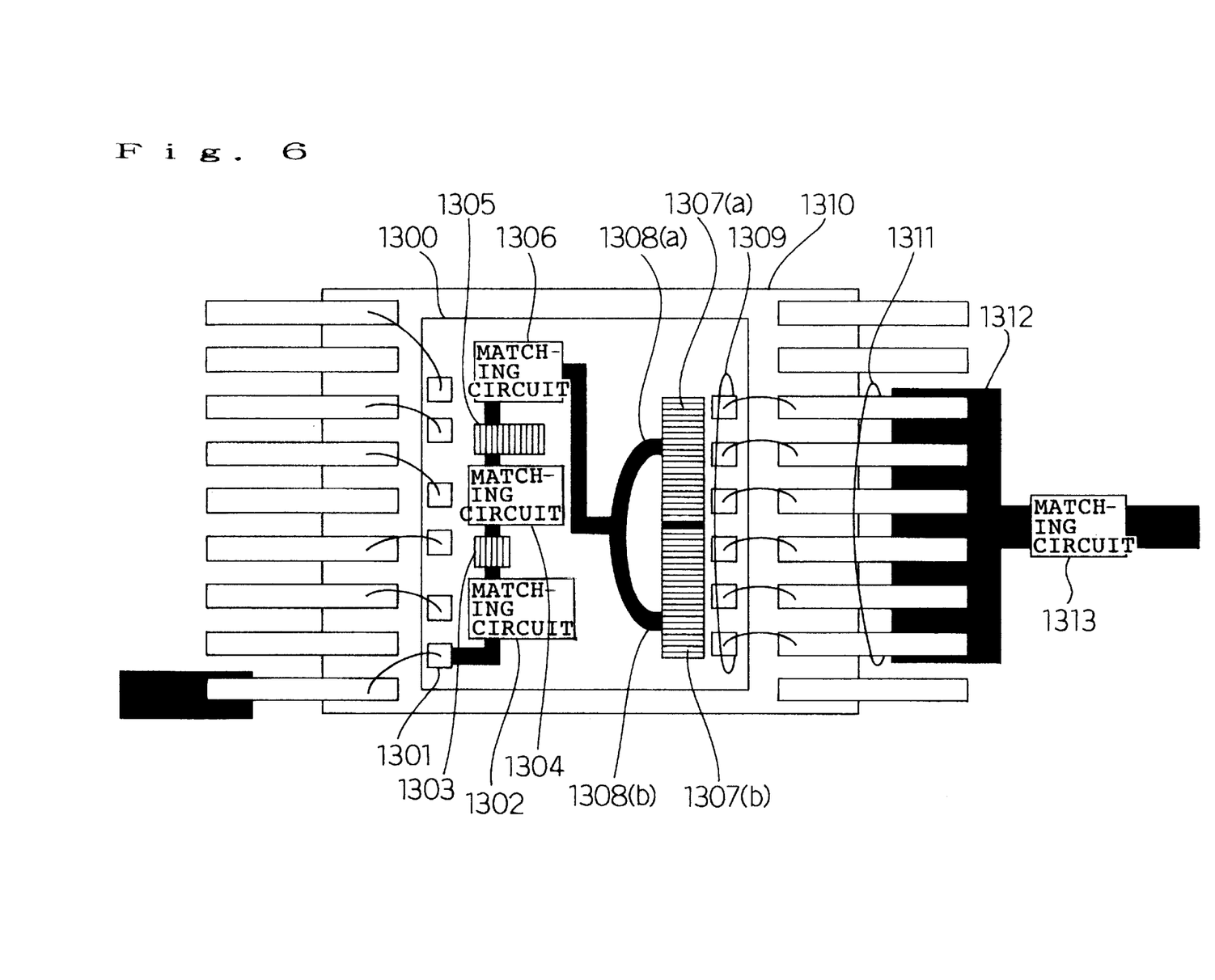
FIG. 6 is a diagram showing the construction of a power amplifier MMIC according to one example of the prior art.

FIG. 6 shows an example of the MMIC with improved layout.

In FIG. 6, reference numeral 1300 is a semiconductor substrate, 1301 is the input terminal, 1302 is the first matching circuit, 1303 is the first transistor, 1304 is the second matching circuit, 1305 is the second transistor, 1306 is the third matching circuit, 1307(a) is a transistor as one half of the third transistor, 1307(b) is a transistor as the other half of the third transistor, 1308(a) is the gate terminal of the one half 1307(a) of the third transistor, 1308(b) is the gate terminal of the other half 1307(b) of the third transistor, 1309 is an output terminal array, 1310 is a package formed from a dielectric material, 1311 is the package lead array, 1312 is an output line, and 1313 is the fourth matching circuit.

Reduction in the chip size can be achieved by connecting the input terminal 1301, the first matching circuit 1302, the first transistor 1303, the second matching circuit 1304, the second transistor 1305, and the third matching 1306 in a vertical array alongside the third transistor 1307(a) and (b), as shown in FIG. 6. This layout method is also used in "An E-Mode GaAs FET Power Amplifier MMIC for GSM Phones," W. Abey et al., IEEE MTT-S Digest, pp. 1315–1318, 1997, and will not be described in detail here.

With the power amplifier MMIC layout shown in FIG. 6, however, if the desired power value is to be obtained, input signals must be applied to the gate terminals of the third transistor 1307(a) and (b) by aligning the amplitude and phase between the signals, and signals from all the output terminals 1309 must be output and combined by aligning them in amplitude and phase. However, to align the amplitude and phase between the input signals applied to the gate terminals 1308(a) and 1308(b) of the third transistor 1307(a) and (b), the output of the third matching circuit 1306 must be divided symmetrically between the two halves of the third transistor 1307(a) and (b), as shown in FIG. 6. In that case, the output of the third matching circuit 1306 must be brought out and signal lines be routed to the respective centers of the third transistor 1307(a) and (b). The resulting problem is that a space that cannot be used for other circuitry is created between the third transistor 1307(a) and (b) and the vertical array of the input terminal 1301, the first matching circuit 1302, the first transistor 1303, the second matching circuit 1304, the second transistor 1305, and the third matching 1306.

SUMMARY OF THE INVENTION

In view of the above problem of the prior art, it is an object of the present invention to provide a power amplifier MMIC that can be manufactured at low cost and that permits reductions in chip size.

A power amplifier MMIC of the present invention comprises:

a first stage amplifier circuit having a transistor and matching circuits provided on input and output sides of said transistor;

a plurality of final stage transistors connected in parallel;

a first line connected between adjacent gates of said plurality of final stage amplifiers;

a second line, connected between adjacent drains of said plurality of final stage amplifiers, for correcting an input signal phase shift caused by the presence of said first line; and an output matching circuit connected to one of connection points between said second line and said drains, and wherein:

an output of said first stage amplifier circuit is coupled to one gate of a final stage transistor whose drain is not connected to said output matching circuit, and said first stage amplifier circuit and said plurality of final stage transistors are arranged longitudinally alongside each other.

A mobile communication terminal of the present invention comprises:

a signal processing circuit for processing a transmit signal;

a mixer for mixing said processed transmit signal;

a power amplifier MMIC according to any one of the present inventions, for amplifying an output from said mixer;

a receive processing circuit for processing a received signal;

an antenna; and a duplexer for directing a signal received by said antenna to said receive processing circuit or directing an output signal from said MMIC to said antenna.

In the power amplifier MMIC of the present invention, input signals to the gate terminals of the third transistor as the final stage transistor are not aligned in phase, but the signal phases are aligned on the drain output side. This achieves an efficient layout of circuit components with minimum wastage of chip space.

According to the power amplifier of the present invention, input signals to the gate terminals of the final stage amplifier transistor are shifted in phase relative to each other, and signals output from the drain terminals are aligned in phase and combined together. This arrangement achieves an MMIC smaller in size and lower in cost than the prior art MMIC.

DESCRIPTION OF THE REFERENCE NUMERALS 101, 301, 1201, 1301. INPUT TERMINAL
102, 302, 1202, 1302. FIRST MATCHING CIRCUIT
103, 303, 1203, 1303. FIRST TRANSISTOR
104, 304, 1204, 1304. SECOND MATCHING CIRCUIT
105, 305, 1205, 1305. SECOND TRANSISTOR
106, 306, 1206, 1306. THIRD MATCHING CIRCUIT
107(a), 107(b). THIRD TRANSISTOR (DIVIDED INTO TWO PARTS)
113, 313, 1313. FOURTH MATCHING CIRCUIT
114. FIRST LINE
115. SECOND LINE
307(a), 307(b), 307(c). THIRD TRANSISTOR (DIVIDED INTO THREE PARTS)
314(a), 314(b). FIRST LINES A AND B
315(a), 315(b). SECOND LINES A AND B
1207(a), 1207(b). THIRD TRANSISTOR (DIVIDED INTO TWO PARTS)
1307(a), 1307(b). THIRD TRANSISTOR (DIVIDED INTO TWO PARTS)

PREFERRED EMBODIMENTS OF THE INVENTION

The present invention will be described below with reference to the drawings illustrating the preferred embodiments thereof.

(Embodiment 1)

Figure 1:
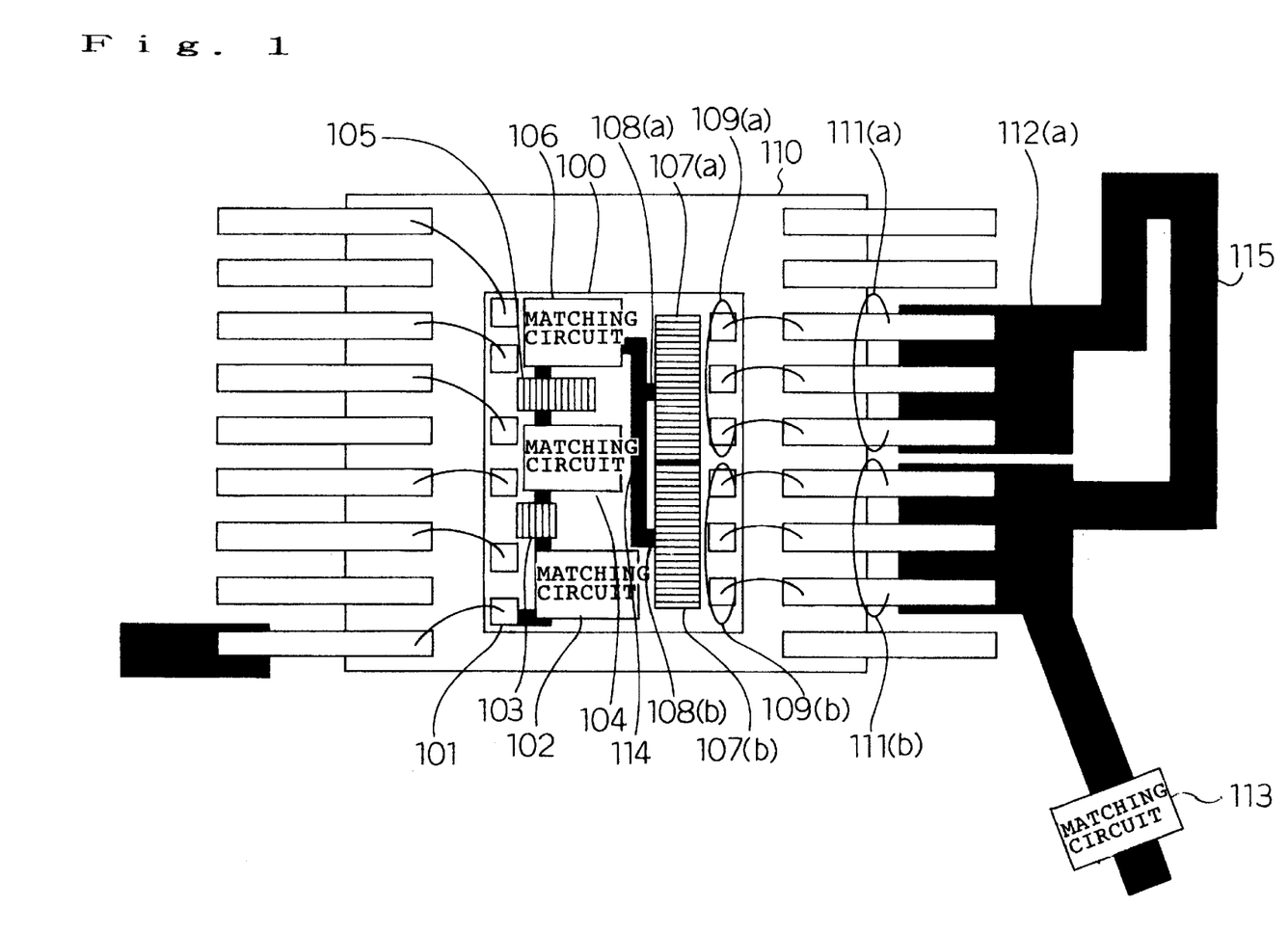
FIG. 1 is a diagram showing the construction of a power amplifier MMIC according to a first embodiment of the present invention.

FIG. 1 is a diagram showing the construction of a power amplifier MMIC according to a first embodiment of the present invention. In FIG. 1, reference numeral 100 is a semiconductor substrate, 101 is an input terminal, 102 is a first matching circuit, 103 is a first transistor, 104 is a second matching circuit, 105 is a second transistor, 106 is a third matching circuit, 107(a) is a transistor as one half of a third transistor, 107(b) is a transistor as the other half of the third transistor, 108(a) is the gate terminal of the one half 107(a) of the third transistor, 108(b) is the gate terminal of the other half 107(b) of the third transistor, 109(a) is a first output terminal connected to the drain terminal of the one half 107(a) of the third transistor, 109(b) is a second output terminal connected to the drain terminal of the other half 107(b) of the third transistor, 110 is a package formed from a dielectric material, 111(a) is a first lead, 111(b) is a second lead, 112(a) is a first output line, 112(b) is asecond output line, 113 is a fourth matching circuit as an output matching circuit, 114 is a first line, and 115 is a second line.

In FIG. 1, the first matching circuit 102, to which the input terminal 101 is coupled, is connected to the gate terminal of the first transistor 103, the second matching circuit 104 is connected between the drain terminal of the first transistor 103 and the gate terminal of the second transistor 105, and the third matching circuit 106 is connected to the drain terminal of the second transistor 105. The circuit from the input terminal 101 to the third matching circuit 106 constitutes the first stage amplifier circuit. The output of the first stage amplifier circuit is coupled to the first gate terminal 108(a), and via the first line 114 to the second gate terminal 108(b). The first output terminal 109(a) is connected to the first output line 112(a) via the first lead 111(a), and the second output terminal 109(b) is connected to the second output line 112(b) via the second lead 111(b). The first output line 112(a) is connected to the second output line 112(b) via the second line 115. Signal is output from this node, via the fourth matching circuit 113.

Next, the operation of the power amplifier MMIC according to the first embodiment will be described with reference to FIG. 2.

Figure 2A:
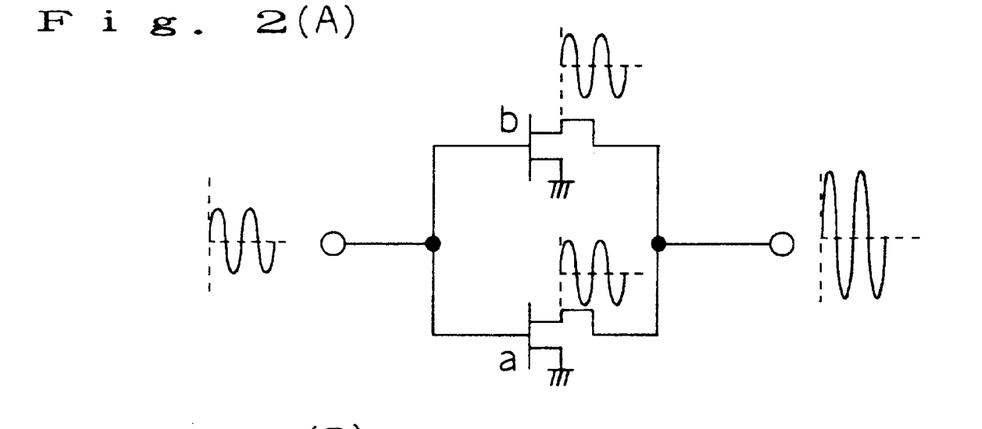
FIGS. 2(A), 2(B), and 2(C) are schematic diagrams for explaining the amplification operation of the power amplifier MMIC according to the first embodiment.
Figure 2B:
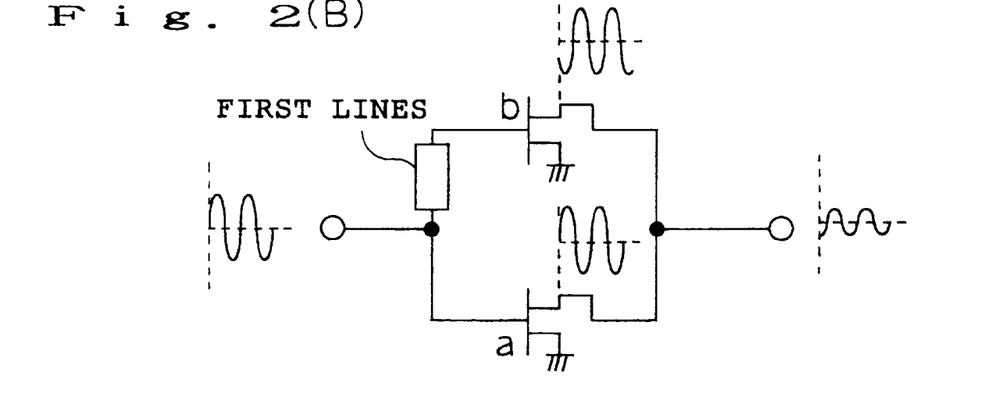
Figure 2C:
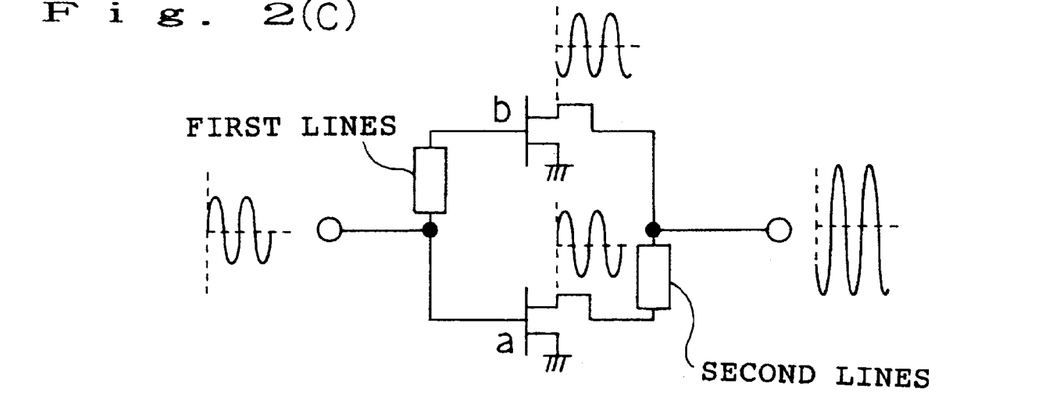

FIGS. 2(A), 2(B), and 2(C) are schematic diagrams illustrating the operation of the third transistor 107 in FIG. 1. In FIG. 2, transistors a and b indicate the respective halves of the third transistor, wherein part (A) of the FIG. 2 illustrates the amplification operation of the transistor for the case where the input signal is symmetrically distributed between the two transistors according to the prior art; part (B) shows the amplification operation of the transistor for the case where the output of the third matching circuit 106 is connected to the first gate terminal 108(a) and the connection point is joined to the first line 114 whose output is coupled to the second gate terminal 108(b), and where the outputs from the two drain terminals are directly combined; and part (C) depicts the amplification operation of the transistor for the case where the output of the third matching circuit 106 is connected to the first gate terminal 108(a) and the connection point is joined to the first line 114 whose output is coupled to the second gate terminal 108(b), and where the first output line 112(a) is connected to the second line 115 whose output is coupled into the second output line 112(b), as in the present embodiment.

In the case of the symmetrical distribution according to the prior art in part (A), since signals are applied in phase to the two transistors a and b, the input signals are amplified in phase and the outputs of the transistors are combined in phase, producing an output further amplified by a factor of two, as shown in the diagram.

In the case of (B), on the other hand, a phase shift relative to the input signal occurs between the transistor a where the signal is input directly and the transistor b where the signal is input via the first line 114. If the outputs are combined directly, they weaken each other.

In view of this, in the case of the present embodiment, signals are applied out of phase to the respective transistors as shown in (C), as in the case of (B), but the phase shift is corrected by the second line 115 so that an amplified output whose power level is twice that of each transistor can be obtained, as in the case of (A).

With the above construction, the present embodiment achieves an efficient layout of components in the three-stage power amplifier, and thus realizes a low cost MMIC with reduced chip size.

(Embodiment 2)

Figure 3:
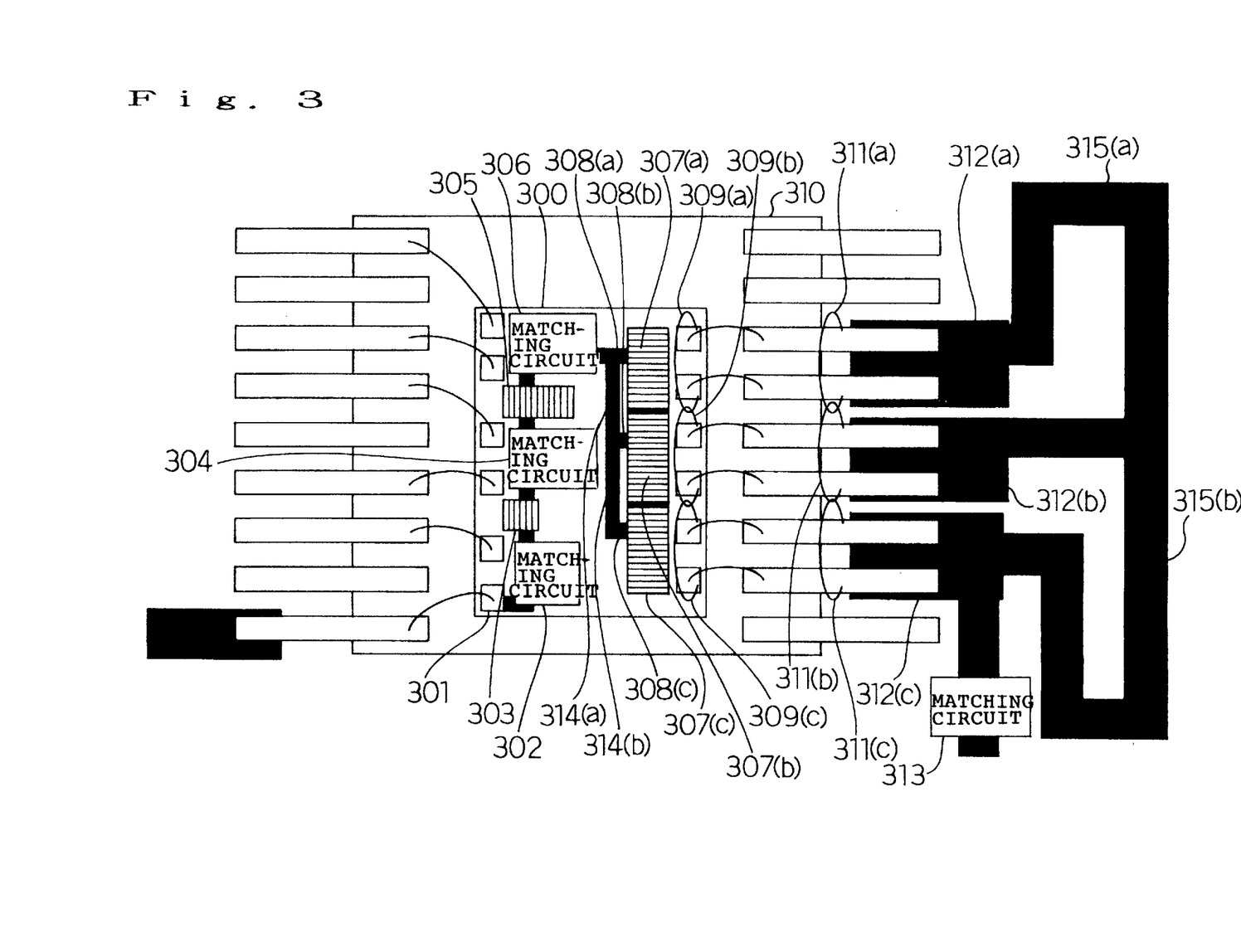
FIG. 3 is a diagram showing the construction of a power amplifier MMIC according to a second embodiment of the present invention.

FIG. 3 is a diagram showing the construction of a power amplifier MMIC according to a second embodiment of the present invention. In FIG. 3, the same constituent elements as those shown in FIG. 1 will be designated by reference numerals whose last two digits are the same as the corresponding numerals in FIG. 1, and will not be described in detail here. The difference from FIG. 1 is that the third transistor is divided into three parts wherein a first line A 314(a) and a first line B 314(b) are connected between the respective gate terminals and the outputs are combined together via second lines A 315(a) and B 315(b) connected to the respective output lines 312(a) and 312(b).

In the above construction, the phase differences occurring between the three split transistors in association with the first lines A 314(a) and B 314(b) are corrected by the second lines A 315(a) and B 315(b), and the thus phase-corrected outputs are combined together. In this way, the same effect as achieved in the first embodiment can be obtained.

In the second embodiment, the third transistor is divided into three parts, but it will be readily apparent that this idea can be extended to four or more divisions; in that case also, the same effect as described above can be obtained.

In the above description, the third transistor has been described as being divided into a plurality of parts, but the same description applies for the case where a plurality of small power amplifiers are arranged in parallel as explained in the prior art.

In the first embodiment, if the input signals are applied 180 degrees out of phase to the split transistors, the same effect as described above can be obtained by connecting a balun to the output terminal.

Further, in the first embodiment, if the input signals are applied 180 degrees out of phase to the split transistors, it is apparent that the same effect as described above can be obtained by connecting a 90-degree hybrid to the output terminal.

Each of the first and second embodiments has been described as using a package formed from a dielectric material, but instead of using such a package, the MMIC may be bonded directly to a printed circuit board with the terminals connected to the electrode patterns; in that case also, the same effect as described above can be obtained.

Figure 7:
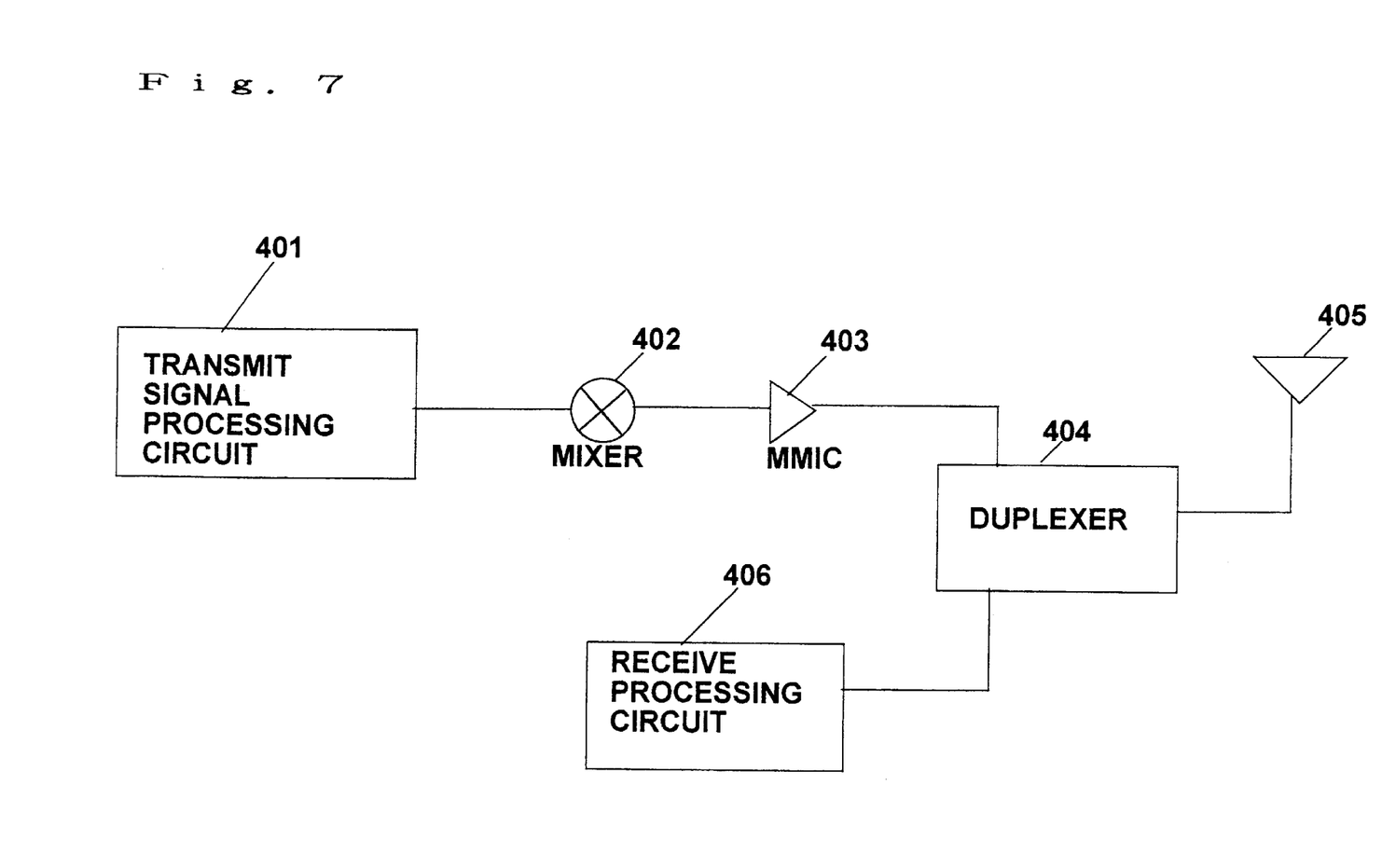
FIG. 7 is a block diagram showing a mobile communication terminal incorporating the power amplifier MMIC of the present invention.

Using the above-described MMIC of the present invention, a mobile communication terminal can be constructed as shown in FIG. 7.

That is, a mixer 402 is connected to an output terminal of a transmit signal processing circuit 401, and the MMIC 403 of the present invention is connected on the opposite side of the mixer 402. The MMIC 403 is in turn connected to a duplexer 404. To this duplexer 404 are connected an antenna 405 and a receive processing circuit 406.

The thus constructed mobile communication terminal according to one embodiment of the present invention operates in the following manner. That is, during transmission, a transmit signal is output from the transmit signal processing circuit 401 and is input to the mixer 402. The signal is frequency converted in the mixer 402 and then fed into the amplifier MMIC 403. The amplified signal is directed via the duplexer 404 to the antenna 405 for radiation into the air.

On the other hand, the signal received by the antenna 405 is input via the duplexer 404 into the receive processing circuit 406 for processing.

Any of the above embodiments has dealt with a three-stage amplifier, but the number of amplifier stages or the circuit configuration thereof is not limited to the illustrated examples and changes may be made within the effect and scope of the present invention.

As is apparent from the above description, according to the present invention, input signals to the gate terminals of the final stage transistor consisting of a plurality of transistors are not aligned in phase, but the signal phases are aligned on the drain output side. This achieves the construction of a power amplifier MMIC at low cost and with reduced chip size.

What is claimed is:

1. A power amplifier MMIC comprising:
   a first stage amplifier circuit having a transistor and matching circuits provided on input and output sides of said transistor;
   a plurality of final stage transistors connected in parallel;
   a first line connected between adjacent gates of said plurality of final stage amplifiers;
   a second line, connected between adjacent drains of said plurality of final stage amplifiers, for correcting an input signal phase shift caused by the presence of said first line; and an output matching circuit connected to one of connection points between said second line and said drains, and wherein:

an output of said first stage amplifier circuit is coupled to one gate of a final stage transistor whose drain is not connected to said output matching circuit, and said first stage amplifier circuit and said plurality of final stage transistors are arranged longitudinally alongside each other.

2. A power amplifier MMIC according to claim 1, wherein each of said drains is connected to said second line via an output terminal and a lead of said final stage transistor.

3. A power amplifier MMIC according to claim 1, wherein said first stage amplifier circuit comprises an input terminal, a first matching circuit connected to said input terminal, a first transistor whose gate is connected to said first matching circuit, a second matching circuit connected to a drain of said first transistor, a second transistor whose gate is connected to said second matching circuit, and a third matching circuit connected to a drain of said second transistor, and said final stage transistors consist of two transistors.

4. A power amplifier MMIC according to claim 2, wherein said first stage amplifier circuit comprises an input terminal, a first matching circuit connected to said input terminal, a first transistor whose gate is connected to said first matching circuit, a second matching circuit connected to a drain of said first transistor, a second transistor whose gate is connected to said second matching circuit, and a third matching circuit connected to a drain of said second transistor, and said final stage transistors consist of two transistors.

5. A power amplifier MMIC according to claim 1, wherein said first stage amplifier circuit comprises an input terminal, a first matching circuit connected to said input terminal, a first transistor whose gate is connected to said first matching circuit, a second matching circuit connected to a drain of said first transistor, a second transistor whose gate is connected to said second matching circuit, and a third matching circuit connected to a drain of said second transistor, and said final stage transistors consist of three transistors arrayed in parallel, wherein said third matching circuit in said first stage amplifier is connected to the gate of the final stage transistor located at one end of said parallel array and said output matching circuit is connected to the gate of the final stage transistor located at the other end thereof.

6. A power amplifier MMIC according to claim 2, wherein said first stage amplifier circuit comprises an input terminal, a first matching circuit connected to said input terminal, a first transistor whose gate is connected to said first matching circuit, a second matching circuit connected to a drain of said first transistor, a second transistor whose gate is connected to said second matching circuit, and a third matching circuit connected to a drain of said second transistor, and said final stage transistors consist of three transistors arrayed in parallel, wherein said third matching circuit in said first stage amplifier is connected to the gate of the final stage transistor located at one end of said parallel array and said output matching circuit is connected to the gate of the final stage transistor located at the other end thereof.

7. A power amplifier MMIC according to claim 1, wherein the input signal phase shift due to the presence of said first line is chosen to be 90 degrees, and a 90-degree hybrid is used in place of said second line.

8. A power amplifier MMIC according to claim 2, wherein the input signal phase shift due to the presence of said first line is chosen to be 90 degrees, and a 90-degree hybrid is used in place of said second line.

9. A power amplifier MMIC according to claim 3, wherein the input signal phase shift due to the presence of said first line is chosen to be 90 degrees, and a 90-degree hybrid is used in place of said second line.

10. A power amplifier MMIC according to claim 1, wherein the input signal phase shift due to the presence of said first line is chosen to be 180 degrees, and a 180-degree hybrid or a balun is used in place of said second line.

11. A power amplifier MMIC according to claim 2, wherein the input signal phase shift due to the presence of said first line is chosen to be 180 degrees, and a 180-degree hybrid or a balun is used in place of said second line.

12. A power amplifier MMIC according to claim 3, wherein the input signal phase shift due to the presence of said first line is chosen to be 180 degrees, and a 180-degree hybrid or a balun is used in place of said second line.

13. A power amplifier MMIC according to claim 1 for amplifying an output from a mixer including a mobile communication terminal comprising:

a signal processing circuit for processing a transmit signal;

said mixer for mixing said processed transmit signal;

a receive processing circuit for processing a received signal;

an antenna; and a duplexer for directing a signal received by said antenna to said receive processing circuit or directing an output signal from said MMIC to said antenna.

14. A power amplifier MMIC according to claim 2 for amplifying an output from a mixer including a mobile communication terminal comprising:

a signal processing circuit for processing a transmit signal;

said mixer for mixing said processed transmit signal;

a receive processing circuit for processing a received signal;

an antenna; and a duplexer for directing a signal received by said antenna to said receive processing circuit or directing an output signal from said MMIC to said antenna.

15. A power amplifier MMIC according to claim 3 for amplifying an output from a mixer including a mobile communication terminal comprising:

a signal processing circuit for processing a transmit signal;

said mixer for mixing said processed transmit signal;

a receive processing circuit for processing a received signal;

an antenna; and a duplexer for directing a signal received by said antenna to said receive processing circuit or directing an output signal from said MMIC to said antenna.

16. A power amplifier MMIC according to claim 5 for amplifying an output from a mixer including a mobile communication terminal comprising:

a signal processing circuit for processing a transmit signal;

said mixer for mixing said processed transmit signal;

a receive processing circuit for processing a received signal;

an antenna; and a duplexer for directing a signal received by said antenna to said receive processing circuit or directing an output signal from said MMIC to said antenna.

17. A power amplifier MMIC according to claim 7 for amplifying an output from a mixer including a mobile communication terminal comprising:
- a signal processing circuit for processing a transmit signal;
- said mixer for mixing said processed transmit signal;
- a receive processing circuit for processing a received signal;
- an antenna; and
- a duplexer for directing a signal received by said antenna to said receive processing circuit or directing an output signal from said MMIC to said antenna.

18. A power amplifier MMIC according to claim 10 for amplifying an output from a mixer including a mobile communication terminal comprising:
- a signal processing circuit for processing transmit signal;
- said mixer for mixing said processed transmit signal;
- a receive processing circuit for processing a received signal;
- an antenna; and
- a duplexer for directing a signal received by said antenna to said receive processing circuit or directing an output signal from said MMIC to said antenna.

* * * * *